US 6,643,833 B1

(12) United States Patent
Nishioka et al.

(10) Patent No.: US 6,643,833 B1
(45) Date of Patent: Nov. 4, 2003

(54) METHOD OF LOCALIZED PLACEMENT MANIPULATION WITHOUT EXTRA LATENCY

(75) Inventors: Kimihiko Nishioka, Hachioji (JP); Koji Ishizaki, Hachioji (JP); Masahiro Kaburaki, Iruma (JP)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/992,651

(22) Filed: Nov. 16, 2001

(51) Int. Cl.[7] .............................................. G06F 17/50
(52) U.S. Cl. ......................................................... 716/8
(58) Field of Search .............................. 716/2, 6, 8, 12, 716/18

(56) References Cited

U.S. PATENT DOCUMENTS 5,128,871 A * 7/1992 Schmitz ........................ 716/17
6,091,892 A * 7/2000 Xue et al. ..................... 716/12

* cited by examiner

Primary Examiner—Vuthe Siek
Assistant Examiner—Thuan Do
(74) Attorney, Agent, or Firm—Christopher P. Maiorana, P.C.

(57) ABSTRACT

A method for placement and manipulation of logic equations of a device design, comprising the steps of (A) identifying one or more logic equations of the device design with placement problems, (B) identifying one or more candidate equations of the logic equations with placement problems, and (C) re-synthesizing the one or more logic blocks of the candidate equations without adding latency to the device design.

19 Claims, 5 Drawing Sheets

METHOD OF LOCALIZED PLACEMENT MANIPULATION WITHOUT EXTRA LATENCY

FIELD OF THE INVENTION

The present invention relates to a method and/or architecture for fitting a design into a programmable logic device (PLD) generally and, more particularly, to a method and/or architecture for fitting a design into a PLD without additional latency.

BACKGROUND OF THE INVENTION

Programmable logic devices (PLDs) can have multiple logic equations (i.e., EQN1 and EQN2), which need to be fit inside the PLD. The "fitting" of equations into the PLD can involve several stages such as (i) design creation (i.e., generation of a formal design), (ii) synthesis (i.e., translating the design into equations expressed in AND-OR form or other logical form more directly implementable in the PLD) and (iii) placement (i.e., allocating silicon resources in a PLD for the equations). After the synthesis step, each of the equations EQN1 and EQN2 typically has numerous inputs and multiple stages. The stages can be the result of a particular way the design is written and/or generated by the synthesis software. Furthermore, either because of inherent capacity limitation of the device, or artificial placement constraints (i.e., pin locking by the designer), the equations EQN1 and EQN2 typically have to be placed in the same final logic block. In this discussion a logic block is where the equation is partly or wholly implemented. However, the final logic block might not be able to accommodate the equations EQN1 and EQN2 (i.e., when the final stage logic block does not have enough input lines to fit the equations EQN1 and EQN2).

Figure 1:
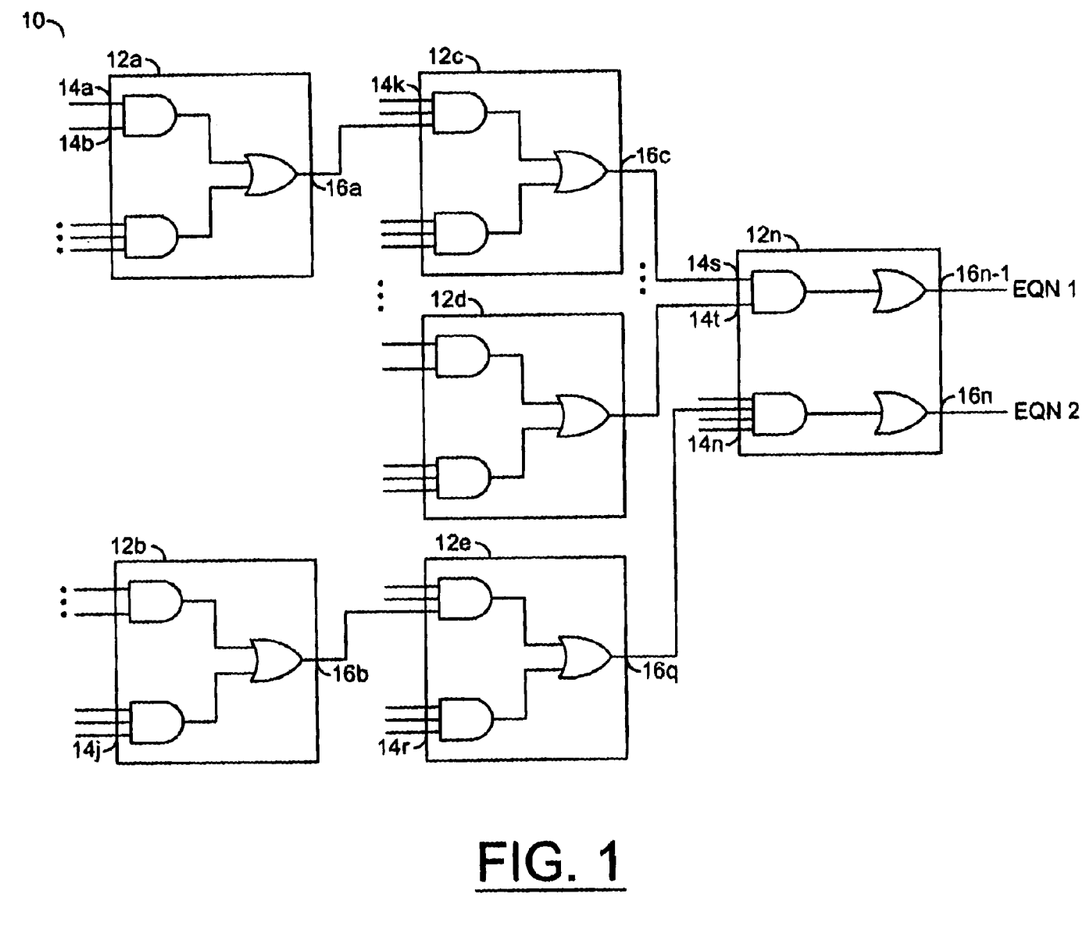
FIG. 1 is a block diagram of a conventional PLD placement implementation.

Referring to FIG. 1, a circuit 10 including a number of logic blocks $12a$–$12n$ is shown. The logic blocks 12 have inputs $14a$–$14n$ and outputs $16a$–$16n$. The logic blocks $12a$, $12c$, $12d$ and $12n$ attempt to fit the equation EQN1. The logic blocks $12b$, $12e$, and $12n$ attempt to fit the equation EQN2. The circuit 10 attempts to place the equations EQN1 and EQN2 in the final logic block $12n$. However, such a configuration is not possible, since the equation EQN2 is partly outside the logic block $12n$. In particular, the design as generated by the software for the equations EQN1 and EQN2 exceeds the capacity of the logic block $12n$ as shown symbolically with the input $14n$ outside of the logic block $12n$. Therefore, the design as generated by the synthesis software is non-functional. In another example, the circuit 10 can be synthesized without proper placement of one or more of the logic blocks 12, the outputs 16, etc. via conventional synthesis software.

Using conventional approaches, changes to make the circuit 10 functional must be made manually at the RTL level or above. Such changes are inconvenient and error prone. Furthermore, the changes are independently specified depending on particular software applications. Thus, the circuit 10 exhibits different behavior when switched to different software applications. The circuit 10 also adds undesired timing latency. Since latency is added to the equations EQN1 and EQN2, such an approach is too cumbersome to ensure correct function of the entire design. Additionally, designers do not have control over the nodal synthesis that leads to additional latency, which can make such change impossible.

Figure 2:
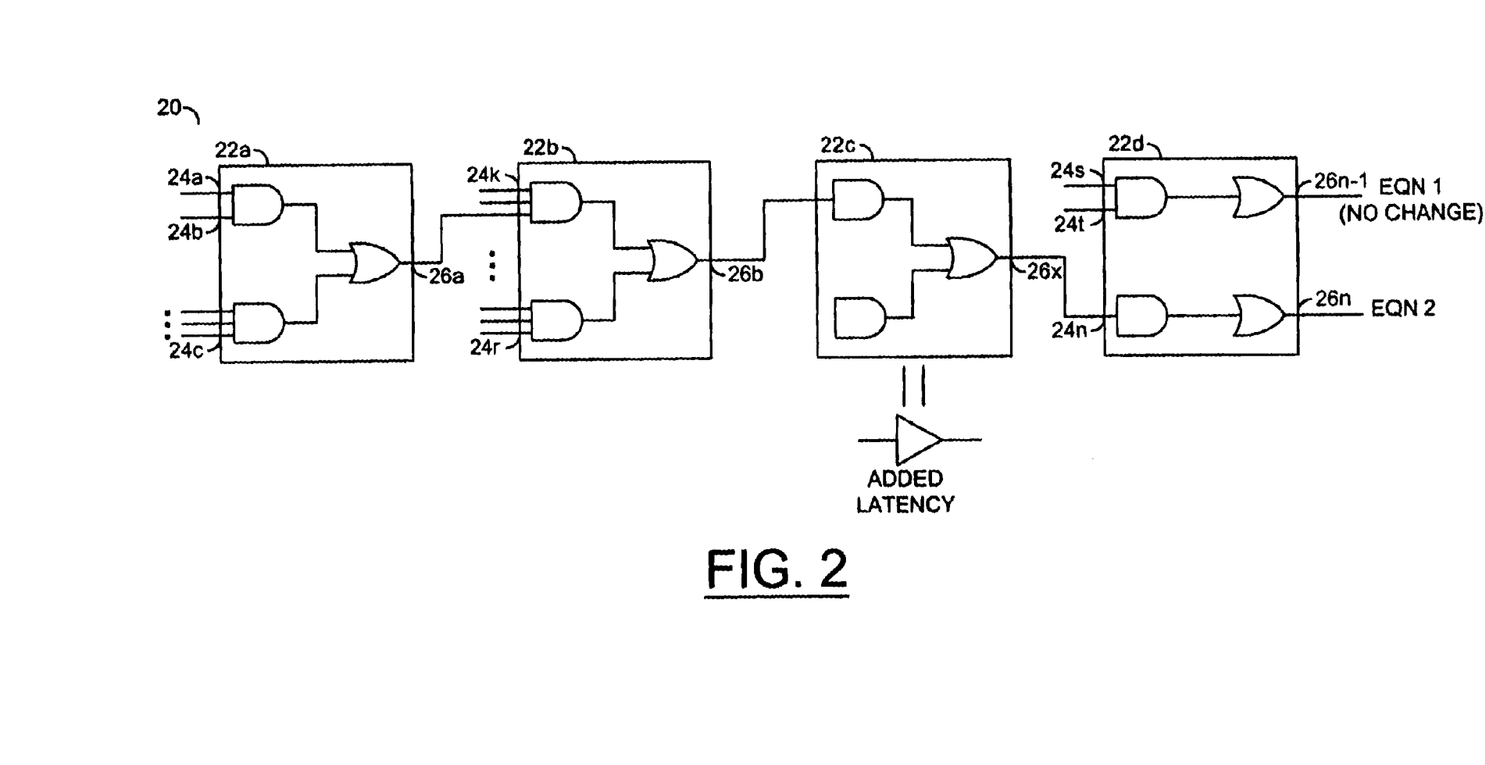
FIG. 2 is a block diagram of another conventional PLD placement implementation.

Referring to FIG. 2, a circuit 20 including a number of logic blocks $22a$–$22d$ having inputs $24a$–$24n$ and outputs $26a$–$26n$ is shown. The implementation of the equation EQN1 is the same as that of FIG. 1 and is not shown. The logic blocks $22a$, $22b$, $22c$ and $22d$ fit the equation EQN2 (i.e., the logic block $22d$ contains all of the inputs $22b$–$22n$). In limited circumstances, manual intervention can be used to solve problems encountered when insufficient inputs are allocated to logic blocks (i.e., by adding a latency stage via the logic block $22c$). The circuit 20 reduces the number of inputs required for the last stage $22d$ of the equations EQN1 and EQN2. However, the additional latency stage $22c$ adds undesirable latency, cost, utilization and development time.

Synthesis software typically provides users with optimization options in the synthesis step. For example, users can specify a level of optimization and synthesized design size (i.e., number of nodes). The user options affect how the software synthesizes a design. For example, with lower nodal cost, the software will generate more stages for the equations EQN1 and EQN2 by adding either parallel or serial stages.

Figure 3:
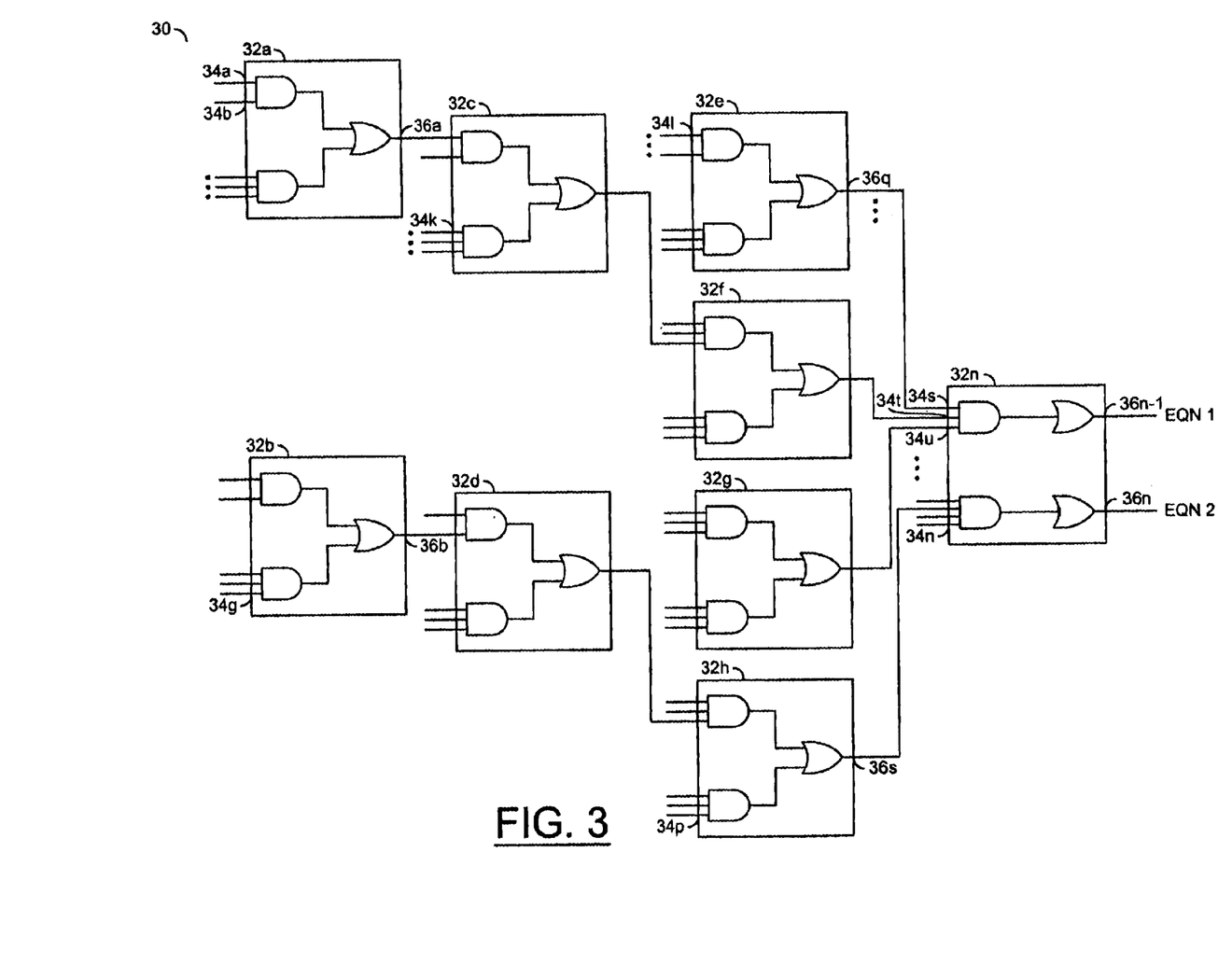
FIG. 3 is a block diagram of another conventional PLD placement implementation.

Referring to FIG. 3, a circuit 30 including a number of stages $32a$–$32i$ is shown. The circuit 30 is affected by user optimization synthesis features. Equations that are originally placed and functioning properly (i.e., EQN1 of the PLD 10) are altered (i.e., in the circuit 10, EQN1 has the two inputs $14s$ and $14t$, while in the circuit 30, EQN1 has the three inputs $34s$, $34t$ and $34u$). Additionally, the circuit 30 does not fit the EQN2 (i.e., symbolically shown by the input $34n$ not placed in the logic block $32n$). Even if the equations can now fit after alterations, because the equations are expanded, more resources are used in the PLD 30, resulting in higher utilization of the die space with no added functional value. Resources are wasted on the PLD 30. The user optimization synthesis features shown in PLD 30 do not provide precise control of resource allocation with regard to expansion and location. Additionally, since the circuit 30 implements a general expansion strategy, timing for the design 30 is changed.

It is generally desirable to have a method and/or architecture for PLD design fitting that (i) provides a simplified localized expansion placement technique without adding latency, (ii) reduces design cost and time, and/or (iii) minimizes die area.

SUMMARY OF THE INVENTION

The present invention concerns a method for placement and manipulation of logic equations of a device design, comprising the steps of (A) identifying one or more logic equations of the device design with placement problems, (B) identifying one or more candidate equations of the logic equations with placement problems, and (C) re-synthesizing the one or more logic blocks of the candidate equations without adding latency to the device design.

The objects, features and advantages of the present invention include providing a method and/or architecture for fitting a design into a PLD that may (i) be implemented without adding latency to the equation output, (ii) preserve design timing (iii) provide localized operations, (iv) provide more optimized device utilization, (v) conserve utilized die area, (vi) provide localized and controlled manipulation and expansion, (vii) be implemented without needing user intervention, (viii) protect valid equation design, (ix) be implemented on internal as well as external nodes, and/or (x) even out device logic placement.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 4:
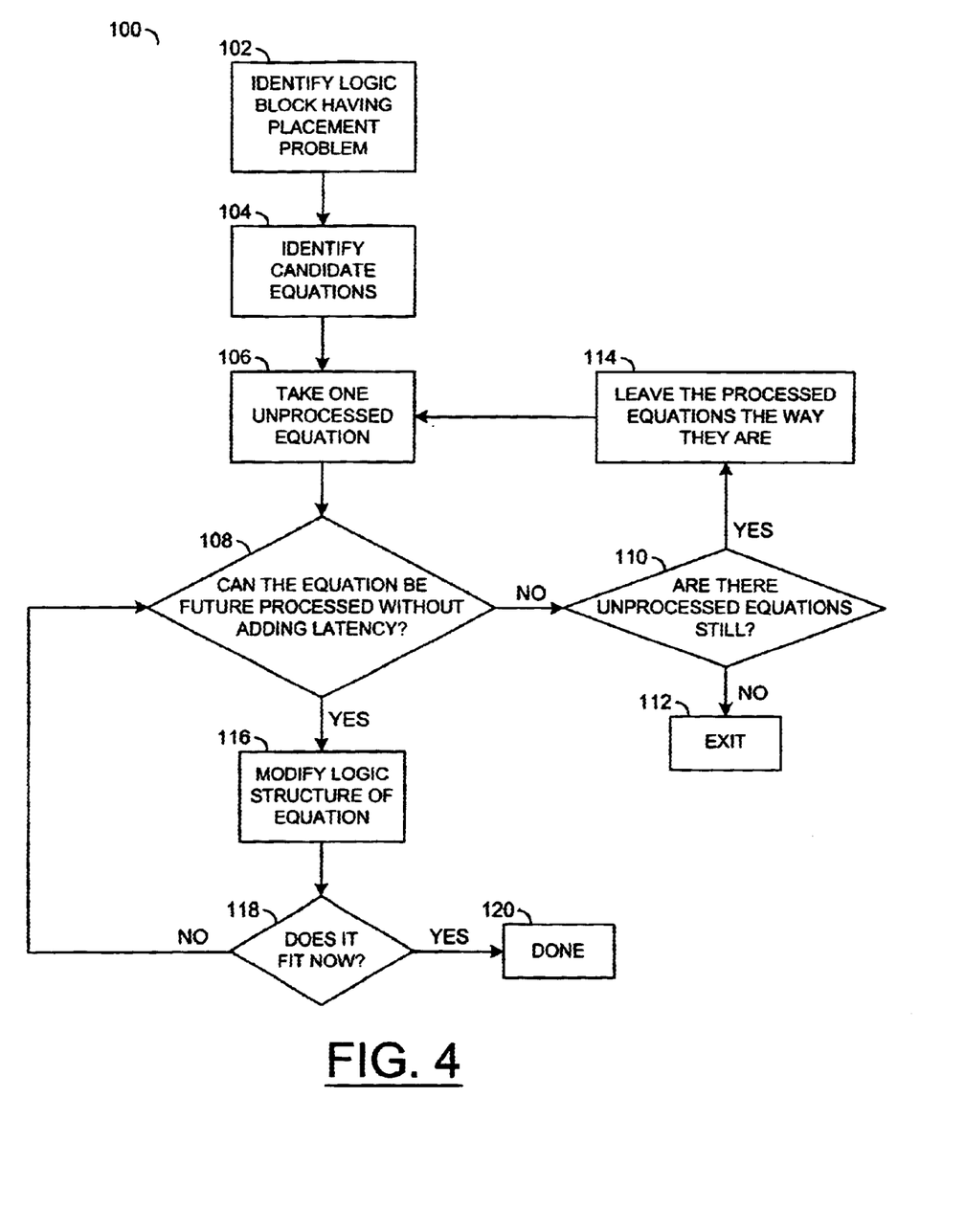
FIG. 4 is a flow chart illustrating an operation of the present invention.

Referring to FIG. 4, a block diagram of a method (or process) 100 is shown in accordance with a preferred embodiment of the present invention. The method 100 may address synthesis software failure to fit equations properly when fitting a design into a programmable logic device (PLD). The method 100 may succeed where placement constraints cause traditional synthesis and placement strategy to fail. In particular, the method 100 may locally manipulate synthesized equations, such that placement may occur without (i) changes in output timing and (ii) over-resource allocation. The method 100 may be configured to examine problem areas in logic placement and alter the logic involved. Additionally, the method 100 may allow logic placement to occur without adding latency to the equations and/or design.

The method 100 generally comprises a state 102, a state 104, a state 106, a decision state 108, a decision state 110, a state 112, a state 114, a state 116, a decision state 118 and a state 120. While in the state 102, the process 100 may identify (e.g., determine) an area having logic placement problems. In one example, the logic placement problem may be a logic block that requires more inputs than the logic block provides (e.g., as shown in FIG. 1 where the input 14$n$ cannot be included in the logic block 12$n$). The process 100 may then continue to the state 104. While in the state 104, the process 100 may identify (e.g., determine) candidate logic equations corresponding to the problematic logic blocks. The candidate equations may be logic equations that are implemented within the logic blocks that have placement problems (e.g., the EQN2 illustrated in FIG. 1). The process 100 may then continue to the state 106. While in the state 106, the process 100 may analyze (or acquire) a single unprocessed equation from the candidate equations that were identified in the state 104. The unprocessed candidate equation that is acquired in the state 106 is generally the equation identified in the state 104 having the greatest number of placement problems (e.g., the largest number of inputs that are not included in a logic block, etc.). In another example (e.g., when the unprocessed candidate equations identified in the state 104 have an equal number of placement problems), the candidate equation that is acquired and analyzed in the state 106 may be an equation corresponding to a logic block located more centrally on the output of the PLD than the other candidate equations. However, any appropriate candidate equation may be selected accordingly to meet the design criteria of a particular application. The state 106 may provide localized identification of the equations and the corresponding logic blocks with placement problems. The process 100 may then continue to the decision state 108.

While in the decision state 108, the process 100 may determine if the unprocessed equation acquired at the state 106 may be re-synthesized in logic without adding latency. The process 100 may examine (e.g., analyze) the candidate equation (e.g., stages of logic, amount of logic in previous stages, number of inputs to the last stage, etc.) to determine if the equation may be re-synthesized without adding latency. If the logic equation cannot be re-synthesized without adding latency, the process 100 may proceed to the decision state 110.

While in the state 110, the process 100 may determine if unprocessed candidate equations remain at the state 106. If no unprocessed candidate equations remain at the state 106, the process 100 may continue to the exit state 112 (e.g., the design may be optimized). If unprocessed candidate equations remain at the state 106, the process 100 may continue to the state 114. While in the state 114, the process 100 may leave the processed equations at the processed condition (e.g., the functional equations and the corresponding logic blocks that meet the design criteria of the particular application may be protected). The process 100 may then return to the state 106. The process 100 may acquire the next unprocessed candidate equation and continue to the state 108.

Returning to the decision state 108, if the candidate equation can be re-synthesized in logic without adding latency, the process 100 may continue to the state 116. While in the state 116, the process 100 may modify the logic structure of the equation. The process 100 may re-synthesize moveable logic and allocate resources for the moveable logic in another one or more of the logic blocks. The process 100 may re-synthesize logic blocks and allocate resources at internal nodes as well as at the output logic blocks. The process 100 may fit the candidate equation within the device design. The process 100 may then continue to the decision state 118.

While in the decision state 118, the process 100 may determine if the processed equation will fit into the PLD package. If the processed equation does not fit, the process 100 may return to the decision state 108. If the processed equation does fit into the PLD package, the process 100 may continue to the done state 120. Fitting is generally successful and is completed.

Figure 5:
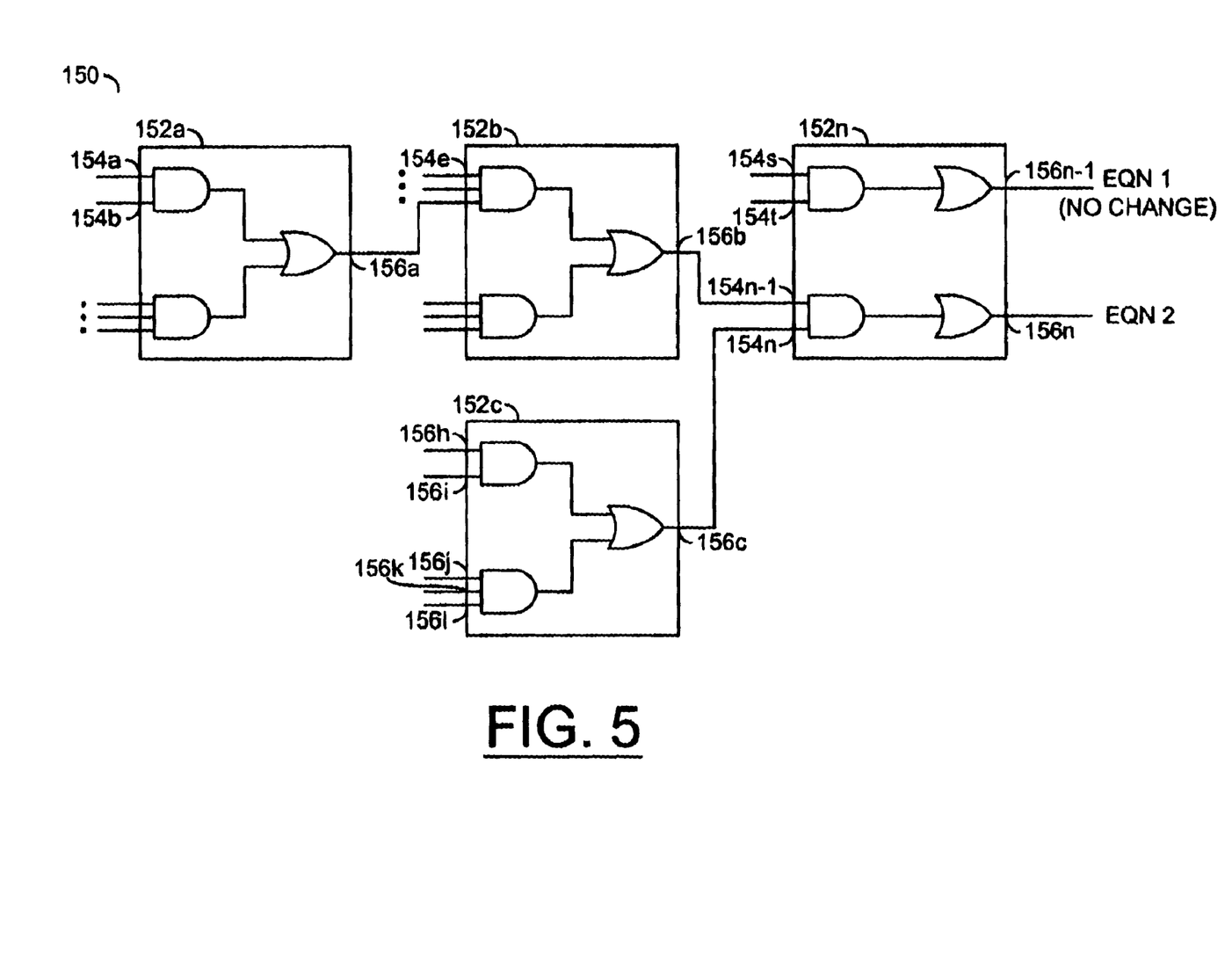
FIG. 5 is a block diagram of an exemplary implementation of the present invention.

Referring to FIG. 5, a block (or circuit) 150 illustrating an implementation of the method 100 is shown. The circuit 150 may be implemented as a programmable logic device (PLD). The circuit 150 may be configured to implement a logic equation (e.g., EQN1) and a logic equation (e.g., EQN2). The equations EQN1 and EQN2 may be similar to the equations EQN1 and EQN2 of FIGS. 1, 2 and 3. However, the circuit 150 may not have the drawbacks as discussed in the background section. The logic circuitry of the circuit 150 may be improved over the circuits 10, 20 and 30. The circuit 150 generally comprises a number of logic blocks 152$a$–152$n$ having a number of inputs 154$a$–154$n$ and a number of outputs 156$a$–156$n$. The logic blocks 152$a$–152$n$ may be configured to implement the logic equations EQN1 and EQN2. Implementation of the equation EQN1 of the circuit 150 (not shown) may be similar to the implementation of the circuit 10 of FIG. 1 since the equation EQN1 may function correctly as initially synthesized. The circuits 152$a$, 152$b$, 152$c$ and 152$n$ may implement the equation EQN2. The circuit 150 may implement the equations EQN1 and EQN2 with full functionality and proper timing but without additional latency or undesirable nodes. The circuit 150 may be implemented having both of the outputs 156(n−1) and 156$n$ fit in the logic block 152$n$. The circuit 150 may require minimal resource manipulation to successfully fit the equations EQN1 and EQN2.

The method 100 may manipulate and place the equations EQN1 and EQN2 of the originally synthesized circuit 10 of FIG. 1 to generate the more fitting-optimized designed circuit 150. The method 100 may implement the solution as follows:

(i) The method 100 may identify logic block placement problems in the circuit 10 of FIG. 1. For example, the equations EQN1 and EQN2 of the logic block 12n demand more inputs 14 than the logic block 12n provides (e.g., the input 14n is not included in the logic block 12n).

(ii) The method 100 may then examine the equation involved EQN2 for logic structure (e.g., stages of logic, amount of logic in the previous stages 12a–12e, number of inputs 14 to the last stage 12n, etc.).

(iii) The method 100 may then determine that the equation EQN2 may be implemented in three stages of logic. Therefore, some of the inputs 14 and logic in the last logic block 12n in FIG. 1 may be moved (e.g., re-synthesized) without adding latency to EQN2 output.

(iv) The method 100 may then change (e.g., re-synthesize) the logic structure of the equation EQN2 by re-allocating resources in the logic block 152c and removing the appropriate resource requirements in the last logic block 152n. Alternatively, some of the logic in the last logic block 152n may be moved to an existing prior stage 152a–152(n-1) without re-allocating resources within the existing logic block (e.g., the existing block 152a–152(n-1) may have slack resources that may be appropriately configured to resolve the placement problem).

(v) The method 100 may allow the equations EQN1 and EQN2 to be placed into the logic block 152n, because of the reduced logic requirements of the equations EQN1 and EQN2 in the last logic block 152n. The method 100 may be repeated for different example manipulations for the same equation or for other equations in the problematic logic block until a solution that meets the design criteria of a particular application is reached.

The method 100 may manipulate equations with consideration of placement and placement related constraints. In one example, the features of the method 100 may be added after the initial PLD logic synthesis step. In another example, the features of the method 100 may be added to the PLD logic synthesis step. The method 100 may avoid conventional techniques such as software generated sum splits when the equation logic is too big for a single logic block. While the present invention has been described in the context of a PLD with logic blocks, the present invention may be implemented in any appropriate design where the design criteria for the particular application does not fit into the device as initially synthesized. The method 100 may be implemented when no user placement constraints have been explicitly provided.

The method 100 may be implemented without adding latency to the PLD output. The method 100 may provide efficient design timing. The method 100 may provide localized operations that may protect functional logic equations from being changed, since changing functional equations may adversely impact the design functioning and timing. The method 100 may provide localized and controlled manipulation to reduce (or eliminate) wasteful expansion of related and unrelated equations. The method 100 may ensure resources are not wasted. The method 100 may be implemented via internal nodes that are not accessed with conventional synthesis techniques. The method 100 may provide better design fitting on PLDs than conventional synthesis techniques. The method 100 may provide more robust design software and therefore reduce consumer frustration encountered when designs fail to fit. The method 100 may even out PLD logic placement. The method 100 may enable the placement of a greater number of equations than conventional techniques. Additionally, the method 100 may be implemented via software, firmware and/or other automated processes in any appropriate computer readable medium.

While the invention has been particularly shown and described with reference to the preferred embodiments thereof, it will be understood by those skilled in the art that various changes in form and details may be made without departing from the spirit and scope of the invention.

What is claimed is:

1. A method for placement and manipulation of logic equations of a device design, comprising the steps of:
    (A) identifying one or more logic blocks of said device design with placement problems and protecting functional logic blocks;
    (B) identifying one or more candidate equations of said logic blocks; and
    (C) re-synthesizing said one or more logic blocks of said candidate equations without increasing latency in said device design.

2. The method according to claim 1, wherein step (A) further comprises:
    providing localized identification of said logic blocks with placement problems.

3. The method according to claim 1, wherein step (B) further comprises:
    protecting functional logic equations.

4. The method according to claim 1, wherein step (C) further comprises:
    determining if said candidate equations can be re-synthesized without adding latency.

5. The method according to claim 4, wherein step (C) further comprises:
    determining if unprocessed candidate equations remain.

6. The method according to claim 5, wherein step (C) further comprises:
    if no unprocessed candidate equations remain, exiting said method.

7. The method according to claim 6, wherein step (C) further comprises:
    if unprocessed candidate equations remain, returning to step (B).

8. The method according to claim 1, wherein step (C) further comprises:
    modifying said logic equations.

9. The method according to claim 8, wherein step (C) further comprises:
    determining if said logic equations fit said device design.

10. The method according to claim 9, wherein step (C) further comprises:
    if said logic equations do not fit said device design, returning to step (B).

11. The method according to claim 10, wherein step (C) further comprises:
    if said logic equations fit said device, completing said method.

12. The method according to claim 1, wherein step (C) further comprises:
    retaining design functionality and timing of said logic equations.

13. The method according to claim 1, wherein steps (A) and (B) further comprises:
   eliminating wasteful expansion of related and unrelated said logic equations.

14. The method according to claim 1, wherein step (C) further comprises:
   placing said logic equation in a programmable logic device (PLD).

15. A computer readable medium configured to perform the steps of claim 1.

16. A method for fitting logic equations of a device design, comprising the steps of:
   (A) identifying one or more logic equations of said device design with placement problems;
   (B) re-synthesizing one or more logic blocks corresponding to one of said logic equations without adding latency and resources to said device design and protecting functional logic blocks; and
   (C) repeating step (B).

17. The method according to claim 16, wherein step (B) further comprises:
   retaining design functionality and timing of said logic equations.

18. The method according to claim 16, wherein step (B) further comprises:
   re-synthesizing one or more of said logic blocks having slack resources.

19. A method for placement and manipulation of logic equations of a device design, comprising the steps of:
   (A) identifying one or more logic blocks of said device design with placement problems;
   (B) identifying one or more candidate equations of said logic blocks and protecting functional logic equations; and
   (C) re-synthesizing said one or more logic blocks of said candidate equations without adding latency to said device design.

* * * * *

UNITED STATES PATENT AND TRADEMARK OFFICE
CERTIFICATE OF CORRECTION

PATENT NO. : 6,643,833 B1 Page 1 of 1
DATED : November 4, 2003
INVENTOR(S) : James H. Lie It is certified that error appears in the above-identified patent and that said Letters Patent is hereby corrected as shown below:

Title page,
Item [75], Inventors, delete "Kimihiko, Nishioka, Hachioji (JP); Koji Ishizaki, Hachioji (JP); Masahiro Kaburaki, Iruma (JP)" and insert -- Lie, James H., Santa Clara, CA --.

Signed and Sealed this

Seventeenth Day of February, 2004

JON W. DUDAS
*Acting Director of the United States Patent and Trademark Office*